(12) United States Patent
Luo et al.

(10) Patent No.: US 10,012,906 B2
(45) Date of Patent: Jul. 3, 2018

(54) DEVELOPING METHOD AND DEVELOPING DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Liping Luo, Beijing (CN); Mingxuan Liu, Beijing (CN); Xiaoxiang Zhang, Beijing (CN); Huishuang Liu, Beijing (CN); Zengbiao Sun, Beijing (CN); Wei Li, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/647,589

(22) Filed: Jul. 12, 2017

(65) Prior Publication Data
US 2018/0017871 A1    Jan. 18, 2018

(30) Foreign Application Priority Data
Jul. 18, 2016    (CN) .......................... 2016 1 0566567

(51) Int. Cl.
*G03D 3/00* (2006.01)
*G03F 7/30* (2006.01)
*G03G 15/10* (2006.01)
*H01L 27/12* (2006.01)
*B05B 13/04* (2006.01)
*B05B 13/02* (2006.01)

(52) U.S. Cl.
CPC ........ *G03F 7/3057* (2013.01); *B05B 13/0228* (2013.01); *B05B 13/0421* (2013.01); *G03F 7/3028* (2013.01); *G03G 15/10* (2013.01); *H01L 27/1259* (2013.01)

(58) Field of Classification Search
USPC .................................................. 396/564, 611
See application file for complete search history.

(56) References Cited

U.S. PATENT DOCUMENTS

2001/0009452 A1*  7/2001  Matsuyama .......... G03F 7/3021
                                                    355/27
2003/0044731 A1*  3/2003  Yoshihara ................ G03D 3/06
                                                    430/325

* cited by examiner

*Primary Examiner* — Rodney Fuller
(74) *Attorney, Agent, or Firm* — Kinney & Lange, P.A.

(57) ABSTRACT

A developing device includes a spraying assembly and a concentration regulating assembly. A developing method usable in the developing device includes: spraying developing agents by a spraying assembly onto respective developing regions on a substrate to be developed; and spraying a regulating liquid by a concentration regulating assembly onto a target developing region on the substrate to be developed to change concentration of the developing agents.

18 Claims, 4 Drawing Sheets

DEVELOPING METHOD AND DEVELOPING DEVICE

CROSS-REFERENCE TO RELATED APPLICATION

This application claims benefit of the Chinese Patent Application No. 201610566567.4, filed with SIPO on 18 Jul. 2016, which is incorporated herein by reference in its entirety.

BACKGROUND OF THE DISCLOSURE

Field of the Disclosure

The present disclosure relates to the field of display technology, and in particular, to a developing method and a developing device.

Description of the Related Art

During producing a thin film transistor (abbreviated as TFT) array substrate, processes such as coating photo resist, exposure, developing and etching are needed. In these processes, the developing process is used mainly to remove photo resist on the exposed substrate and form a desired pattern in advance to further carry out the etching process.

In the prior art, a developing device used in the developing process is typically a spray-type developing device. The developing device typically includes a transport assembly and a developing agent nozzle arranged above the transport assembly. In the developing process, a substrate that has been exposed may be placed on the transport assembly and the transport assembly may drive the substrate to move along a predetermined direction while the developing agent nozzle may spray developing agents onto a surface of the substrate. The developing agent may dissolve the photo resist so as to form the desired pattern on the substrate in advance.

SUMMARY

An embodiment of the present disclosure provides a developing method comprising: spraying developing agents by a spraying assembly onto respective developing regions on a substrate to be developed; and spraying a regulating liquid by a concentration regulating assembly onto a target developing region on the substrate to be developed to change concentration of the developing agents.

In an embodiment, the developing agents sprayed by the spraying assembly onto respective developing regions on the substrate to be developed have a same concentration.

In an embodiment, the respective developing regions on the substrate to be developed have a same developing speed during a developing process.

In an embodiment, spraying a regulating liquid by a concentration regulating assembly onto a target developing region on the substrate to be developed to change concentration of the developing agents comprises: controlling a regulating parameter of the concentration regulating assembly such that the concentration regulating assembly sprays the regulating liquid onto the target developing region on the substrate to be developed depending on the regulating parameter to change concentration of the developing agents, the regulating parameter comprising at least one of an operation status, a spray mount and a spray temperature, and the operation status comprising switching on or switching off.

In an embodiment, the regulating parameter comprises the operation status, and controlling the regulating parameter of the concentration regulating assembly comprises: during a developing process, detecting whether a developing region to which a spraying direction of the concentration regulating assembly is directed on the substrate to be developed is the target developing region, or not; switching on the concentration regulating assembly when the developing region to which the spraying direction of the concentration regulating assembly is directed on the substrate to be developed is the target developing region; or switching off the concentration regulating assembly when the developing region to which the spraying direction of the concentration regulating assembly is directed on the substrate to be developed is not the target developing region.

In an embodiment, the regulating parameter comprises the spray mount and/or the spray temperature, and controlling the regulating parameter of the concentration regulating assembly comprises: detecting thickness of photo resist in the respective developing regions on the substrate to be developed after the developing agents have been sprayed onto the respective developing regions; controlling the spray mount and/or the spray temperature of the concentration regulating assembly depending on the thickness of photo resist in the respective developing regions after the developing agents have been sprayed onto the respective developing regions.

In an embodiment, the developing regions on the substrate to be developed comprise: a display region and a driving region located around the display region and provided with a gate driving circuit; and wherein controlling the spray mount and/or the spray temperature of the concentration regulating assembly depending on the thickness of photo resist in the respective developing regions after the developing agents have been sprayed onto the respective developing regions comprises: calculating difference between thickness of photo resist in the display region after the developing agent has been sprayed onto the display region and thickness of photo resist in the driving region after the developing agent has been sprayed onto the driving region, controlling the spray mount and/or the spray temperature of the concentration regulating assembly depending on the difference such that the spray mount and/or the spray temperature of the concentration regulating assembly is in positive correlation with the difference.

In an embodiment, the developing regions on the substrate to be developed comprise: a display region and a driving region located around the display region and provided with a gate driving circuit; and wherein the target developing region is the driving region and the regulating liquid is configured to dilute concentration of the developing agent; or the target developing region is the display region and the regulating liquid is configured to increase concentration of the developing agent.

An embodiment of the present disclosure provides a developing device comprising: a spraying assembly configured to spray developing agents onto respective developing regions on a substrate to be developed; a concentration regulating assembly configured to spray a regulating liquid onto a target developing region on the substrate to be developed to change concentration of the developing agents.

In an embodiment, the spraying assembly is configured to spray developing agents with same concentration onto respective developing regions on the substrate to be developed.

In an embodiment, the concentration regulating assembly is configured to spray the regulating liquid onto the target developing region on the substrate to be developed to change concentration of the developing agents such that the respective developing regions on the substrate to be developed have a same developing speed during a developing process.

In an embodiment, the developing device further comprises: a control assembly; wherein the control assembly is electrically connected to the concentration regulating assembly and configured to control a regulating parameter of the concentration regulating assembly such that the concentration regulating assembly sprays the regulating liquid onto the target developing region on the substrate to be developed depending on the regulating parameter to change concentration of the developing agents, the regulating parameter comprising at least one of an operation status, a spray mount and a spray temperature, and the operation status comprising switching on or switching off.

In an embodiment, the regulating parameter comprises the operation status, and the developing device further comprises a region detection assembly electrically connected to the control assembly, wherein the region detection assembly is configured to: during a developing process, detect whether a developing region to which a spraying direction of the concentration regulating assembly is directed on the substrate to be developed is the target developing region, or not; send a switch-on instruction to the control assembly to cause the control assembly to switch on the concentration regulating assembly depending on the switch-on instruction when the developing region to which the spraying direction of the concentration regulating assembly is directed on the substrate to be developed is the target developing region; or send a switch-off instruction to the control assembly to cause the control assembly to switch off the concentration regulating assembly depending on the switch-off instruction when the developing region to which the spraying direction of the concentration regulating assembly is directed on the substrate to be developed is not the target developing region.

In an embodiment, the regulating parameter comprises the spray mount and/or the spray temperature, and wherein the developing device further comprises: a thickness detection assembly electrically connected to the control assembly and configured to detect thickness of photo resist in the respective developing regions on the substrate to be developed after the developing agents have been sprayed onto the respective developing regions and send the thickness of photo resist in the respective developing regions on the substrate to be developed after the developing agents have been sprayed onto the respective developing regions to the control assembly; and wherein the control assembly is further configured to control the spray mount and/or the spray temperature of the concentration regulating assembly for spraying the regulating liquid, depending on the thickness of photo resist in the respective developing regions after the developing agents have been sprayed onto the respective developing regions.

In an embodiment, the spraying assembly comprises a plurality of nozzles arranged along a first direction and spaced from each other and the concentration regulating assembly comprises a plurality of pinhole-shaped nozzles arranged along the first direction and spaced from each other.

In an embodiment, the developing device further comprises: a transport assembly configured to carry the substrate to be developed and transport the substrate along a second direction, the second direction being perpendicular to the first direction; wherein the spraying assembly and the concentration regulating assembly are fixed above the transport assembly.

In an embodiment, the transport assembly comprises a plurality of transporting rollers arranged along the second direction and spaced from each other.

In an embodiment, the spraying assembly and the concentration regulating assembly are arranged along the second direction above the transport assembly.

In an embodiment, a length of the concentration regulating assembly in the first direction is equal to a width of the substrate to be developed in a widthwise direction, the widthwise direction of the substrate to be developed being parallel to the first direction.

In an embodiment, the regulating liquid comprises deionized water or developing agent with concentration greater than a predetermined threshold.

BRIEF DESCRIPTION OF THE DRAWINGS

In order to explain technical solutions of embodiments in the present disclosure more clearly, the drawings for the embodiments will be described briefly below. Apparently, the following drawings in the description below show only some of embodiments in the present disclosure. From these drawings, the skilled person in the art may also obtain other drawings without any creative efforts.

DETAILED DESCRIPTION OF PREFERRED EMBODIMENTS OF THE DISCLOSURE

Figure 1:
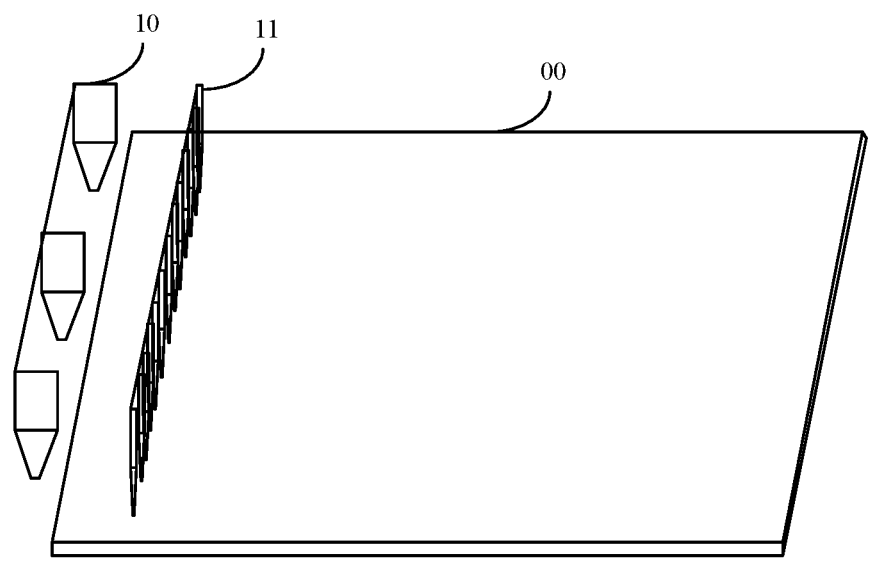
FIG. 1 is a schematic view showing a structure of a developing device according to an embodiment of the present disclosure.

The details of embodiments of the present disclosure will below be explained with reference to drawings such that objects, technical solutions and advantages of the present disclosure become more explicit.

In accordance with a generic technical concept of the present disclosure, an embodiment of the present disclosure provides a developing method including: spraying developing agents by a spraying assembly onto respective developing regions on a substrate to be developed; and spraying a regulating liquid by a concentration regulating assembly onto a target developing region on the substrate to be developed to change concentration of the developing agents.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic view showing a structure of a developing device according to an embodiment of the present disclosure. As shown in FIG. 1, the developing device may include a spraying assembly 10 and a concentration regulating assembly 11. As an example, the spraying assembly 10 may be configured to spray developing agents onto respective developing regions on a substrate to be developed; and the concentration regulating assembly 11 may be configured to spray a regulating liquid onto a target developing region on the substrate to be developed to change concentration of the developing agents.

Figure 2:
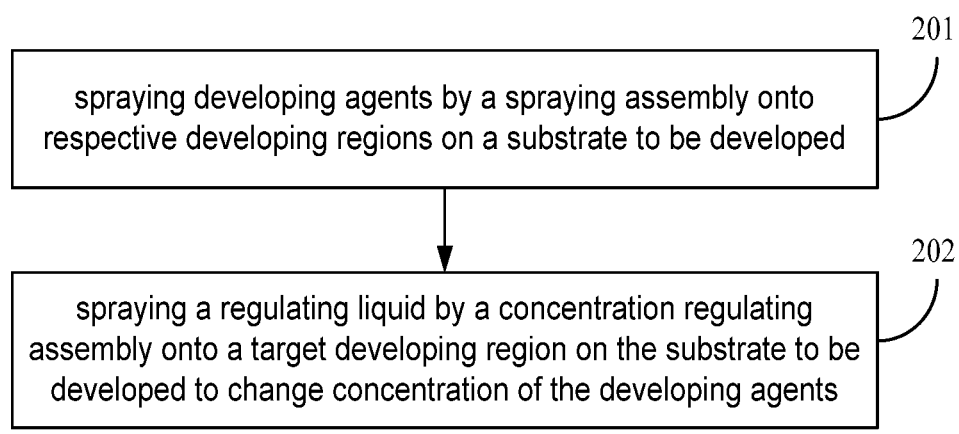
FIG. 2 is a flow chart showing a developing method according to an embodiment of the present disclosure.

FIG. 2 is a flow chart showing a developing method according to an embodiment of the present disclosure. The developing method may be used in the developing device shown in FIG. 1. As illustrated in FIG. 2, the method may include:

Step 201 of spraying developing agents by a spraying assembly onto respective developing regions on a substrate to be developed; and Step 202 of spraying a regulating liquid by a concentration regulating assembly onto a target developing region on the substrate to be developed to change concentration of the developing agents.

In the prior art, as there are different densities of TFT and different densities of patterns to be formed in different regions on the substrate, the developing speeds in different regions on the substrate become different in the developing process, that is, the regions with low densities of patterns (for example a display region) will consume more developing agents to cause relatively low concentration of the developing agents and relatively slow developing speeds in the regions; in contrast, the regions with high densities of patterns (for example a driving region in which a gate driving circuit is arranged) will consume less developing agents to cause relatively high concentration of the developing agents and relatively fast developing speeds in the regions. Thus, the regions with high densities of patterns tend to be developed excessively to cause poor developing uniformity of the developing device.

The developing device and the developing method provided by embodiments of the present disclosure may spray regulating liquid by the concentration regulating assembly onto the target developing region on the substrate to be developed upon developing the substrate, thus, the concentration of the developing agent in the respective developing regions on the substrate to be developed may be regulated by the concentration regulating assembly, so as to reduce the difference in developing speeds in the respective developing regions on the substrate to be developed in the developing process and to improve the developing uniformity of the developing device upon developing the substrate.

In an example, the developing agents sprayed by the spraying assembly onto respective developing regions on the substrate to be developed have a same concentration. It is helpful to reduce the difficulty of regulating concentration. However, it is not necessary, for example, the spraying assembly 10 may also spray the developing agents with different concentrations onto the respective developing regions on the substrate to be developed.

As an example, the respective developing regions on the substrate to be developed have a same developing speed during a developing process. It may ensure that the respective developing regions on the substrate to be developed can have the same developing speed during the developing process.

In an example, the step 202 in particular includes:

controlling a regulating parameter of the concentration regulating assembly such that the concentration regulating assembly sprays the regulating liquid onto the target developing region on the substrate to be developed depending on the regulating parameter to change concentration of the developing agents, the regulating parameter including at least one of a operation status, a spray mount and a spray temperature, the operation status including switching on or switching off.

Figure 3:
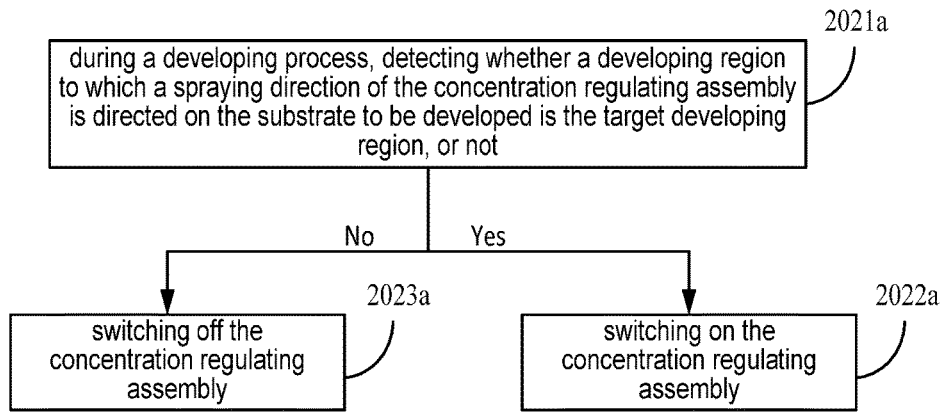
FIG. 3 is a flow chart showing a method for controlling a regulating parameter of a concentration regulating assembly according to an embodiment of the present disclosure.

As an example, the regulating parameter includes the operation status. Referring to FIG. 3, the specific process of controlling the regulating parameter of the concentration regulating assembly in the above step 202 may include:

Step 2021a of, during a developing process, detecting whether a developing region to which a spraying direction of the concentration regulating assembly is directed on the substrate to be developed is the target developing region, or not.

When the developing region to which the spraying direction of the concentration regulating assembly is directed on the substrate to be developed is the target developing region, the Step 2022a is performed; in contrast, when the developing region to which the spraying direction of the concentration regulating assembly is directed on the substrate to be developed is not the target developing region, the Step 2023a is performed.

In an example, the spraying assembly 10 in the developing device according to an embodiment of the present disclosure may be configured to spray developing agents with same concentration onto respective developing regions on the substrate to be developed. It contributes to reducing the difficulty of regulating concentration. However, it is not necessary, for example, the spraying assembly 10 may also spray the developing agents with different concentrations onto the respective developing regions on the substrate to be developed.

As an example, the concentration regulating assembly 11 in the developing device according to an embodiment of the present disclosure may be configured to spray the regulating liquid onto the target developing region on the substrate to be developed to change concentration of the developing agents such that the respective developing regions on the substrate to be developed have a same developing speed during a developing process. It may be ensured that the respective developing regions on the substrate to be developed have the same developing speed during the developing process.

Figure 4:
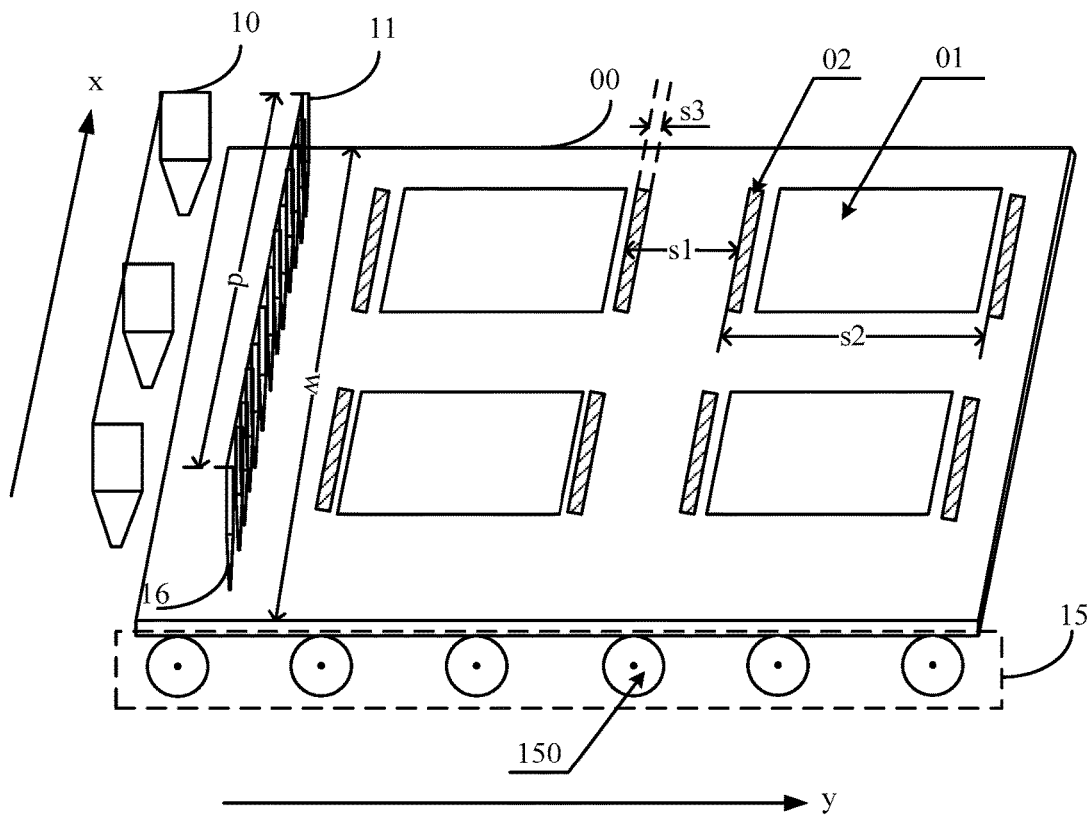
FIG. 4 is a schematic view showing a structure of another developing device according to an embodiment of the present disclosure.

FIG. 4 is a schematic view showing a structure of another developing device according to an embodiment of the present disclosure. As shown in FIG. 4, the developing regions on the substrate 00 to be developed may include: a display region 01 and a driving region 02 located around the display region 01 and provided with a gate driving circuit.

After the spraying assembly 10 sprays the developing agents with same concentration and same amount onto the respective developing regions on the substrate 00 to be developed, as there are more TFTs to be formed in the driving region 02, the driving region 02 has a relatively high density of patterns. In comparison with the display region 01, the driving region 02 has relatively less consumption amount of the developing agents in unit time. Thus, during the developing process, there is relatively high concentration in real-time of the developing agents and relatively fast developing speed in the driving region 02.

In an embodiment of the present disclosure, on one hand, the target developing region may be the driving region 02 and the regulating liquid can dilute the concentration of the developing agent, in this case, the regulating liquid may for example be de-ionized water; on the other hand, the target developing region may also be the display region 01 and the regulating liquid can increase the concentration of the developing agent (for example condense the developing agent), in this case, the regulating liquid may be developing agent with concentration greater than a predetermined threshold. The predetermined threshold may be the concentration of the developing agent sprayed by the spraying assembly 10. By means of regulating the real-time concentration of the developing agent in the target developing region, the real-time concentration of the developing agent in the display region 01 may be equal to the real-time concentration of the developing agent in the driving region 02, so as to ensure the respective developing regions on the substrate 00 to be developed to keep the same developing speed during the developing process.

Figure 5:
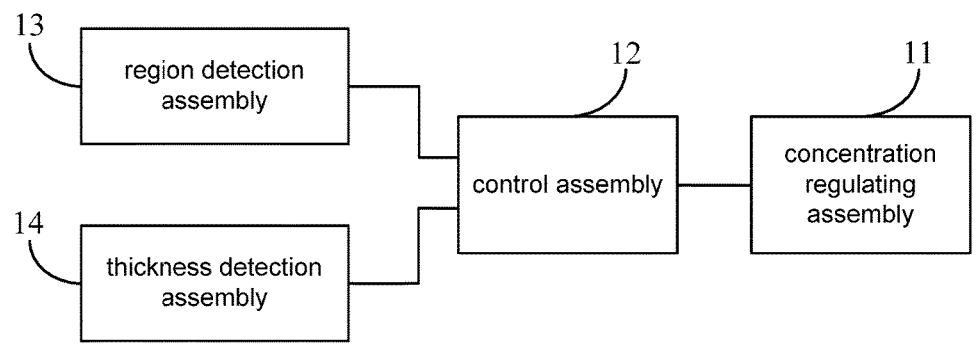
FIG. 5 is a schematic view showing a structure of a further developing device according to an embodiment of the present disclosure.

FIG. 5 is a schematic view showing a structure of a further developing device according to an embodiment of the present disclosure. As shown in FIG. 5, the developing device may further include: a control assembly 12 and a region detection assembly 13 electrically connected to the control assembly 12. The control assembly 12 is configured to control a regulating parameter of the concentration regulating assembly 11. The concentration regulating assembly 13 is configured to, during a developing process, detect whether a developing region to which a spraying direction of the concentration regulating assembly 11 is directed on the substrate to be developed is the target developing region, or not.

In an embodiment of the present disclosure, the region detection assembly 13 may for example be a grating scale sensor which may be arranged in the concentration regulating assembly 11. The grating scale may be arranged in the respective developing regions on the substrate to be developed. During the developing process, when the concentration regulating assembly 11 moves with respect to the substrate to be developed, the grating scale sensor may detect and recognize the leading and trailing positions of the respective developing regions by means of the grating scales in different developing regions.

Figure 6:
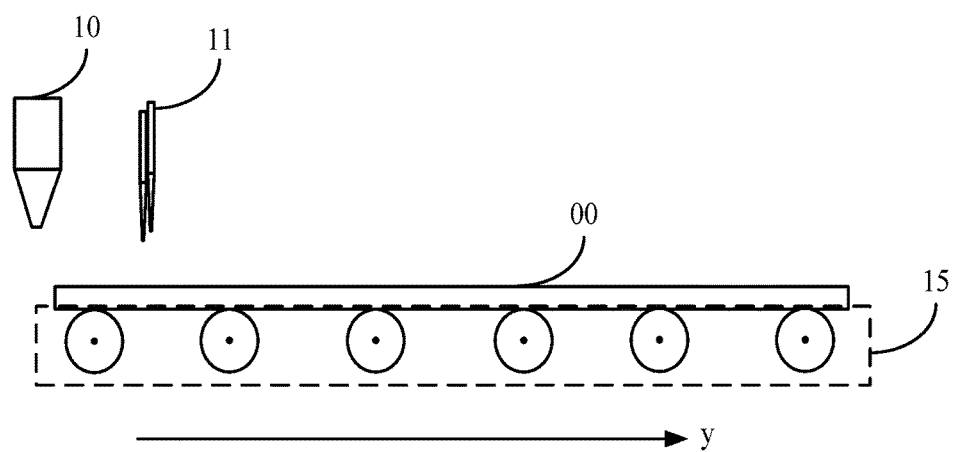
FIG. 6 shows a side view showing the developing device shown in FIG. 4.

Or, the region detection assembly 13 may further determine whether a developing region to which a spraying direction of the concentration regulating assembly is directed is the target developing region, or not, from dimensions of the respective developing regions on the substrate to be developed, a pitch between adjacent developing regions and the relative moving speed between the concentration regulating assembly and the substrate to be developed during the developing process. As an example, FIG. 6 is a side view of the developing device shown in FIG. 4. It is assumed that as shown in FIG. 6, during the developing process, the concentration regulating assembly 11 keeps a constant position and the substrate 00 to be developed moves in y direction at a constant speed v and as shown in FIG. 4, two adjacent driving regions 02 on the substrate 00 to be developed have pitches of s1 and s2 in the y direction respectively, and each driving region 02 has a width of s3 in the y direction. Then the region detection assembly may determine that during the developing process, per a period t1 or period t2, the developing region to which the spraying direction of the concentration regulating assembly 11 is directed is the driving region 02, where t1=s1/v and t2=s2/v. Thus, the region detection assembly may send a switch-on instruction to the control assembly once per the period t1 or period t2, such that the control assembly switches on the concentration regulating assembly depending on the switch-on instruction. Further, after the switch-on instruction is sent at each time, the region detection assembly may also send a switch-off instruction to the control assembly per a period t3, such that the control assembly switches off the concentration regulating assembly depending on the switch-off instruction, where t3=s3/v.

The Step 2022a is to switch on the concentration regulating assembly.

When the developing region to which the spraying direction of the concentration regulating assembly is directed on the substrate to be developed is the target developing region, the control assembly may switch on the concentration regulating assembly.

As an example, if the target developing region is the driving region 02 shown in FIG. 4, the control assembly may switch on the concentration regulating assembly 11 when the spraying direction of the concentration regulating assembly 11 is directed to the driving region 02 such that the concentration regulating assembly 11 sprays the regulating liquid to the driving region 02, for example, may spray the de-ionized water to reduce the real-time concentration of the developing agent in the driving region 02.

The Step 2023a is to switch off the concentration regulating assembly.

When the developing region to which the spraying direction of the concentration regulating assembly is directed on the substrate to be developed is not the target developing region, the control assembly may switch off the concentration regulating assembly.

As an example, when the spraying direction of the concentration regulating assembly 11 is directed to the display region 01, the control assembly may switch off the concentration regulating assembly 11 in order to ensure that the display region 01 can keep relatively high concentration of the developing agent. In this way, it can ensure that the display region and the driving region have the same developing speed during the developing process, so as to enhance the developing uniformity of the developing device when it develops the substrate.

Figure 7:
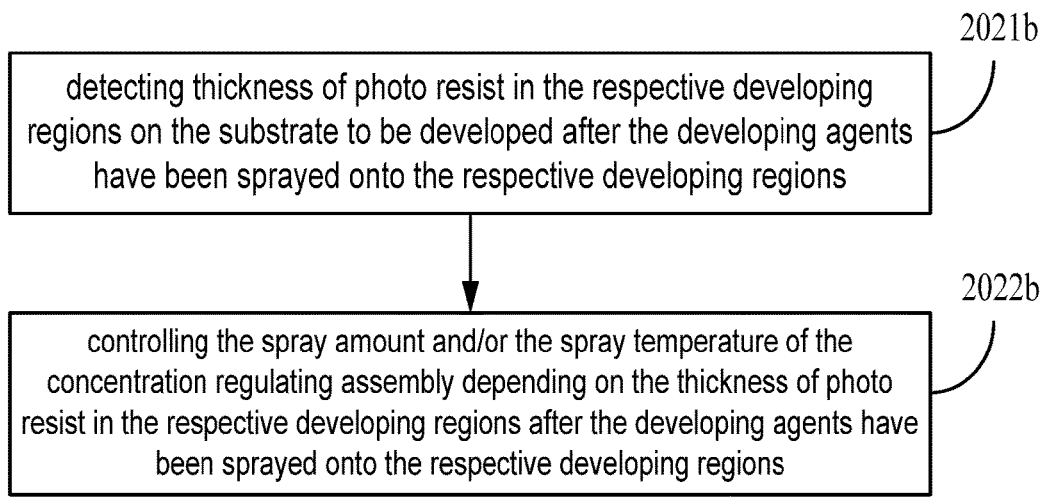
FIG. 7 is a flow chart showing another method for controlling a regulating parameter of a concentration regulating assembly according to an embodiment of the present disclosure.

As an example, the regulating parameter may include the spray mount and/or the spray temperature. As illustrated in FIG. 7, controlling the regulating parameter of the concentration regulating assembly in the above Step 202 in particular may include:

Step 2021b of detecting thickness of photo resist in the respective developing regions on the substrate to be developed after the developing agents have been sprayed onto the respective developing regions.

In an embodiment of the present disclosure, as shown in FIG. 5, the developing device may further include: a thickness detection assembly 14 electrically connected to the control assembly 12 and configured to detect thickness of photo resist in the respective developing regions on the substrate to be developed after the developing agents have been sprayed onto the respective developing regions and send the thickness of photo resist in the respective developing regions on the substrate to be developed after the developing agents have been sprayed onto the respective developing regions to the control assembly 12.

In practice, a developing test may be performed on a sample substrate before batch developing. During the developing test, only the spraying assembly 10 is used to spray the developing agent onto the substrate to be developed. After the developing test ends, the thickness of photo resist in different developing regions on the sample substrate may be detected by the thickness detection assembly 14 and the detection results are sent to the control assembly 12. For example, the thickness of photo resist of TFT channels in the driving region 02 and the thickness of photo resist of TFT channels in the display region 01 may be measured respectively. As the consumption amount of the developing agent in the driving region 02 is less and the concentration of the residual developing agent is relatively high, the thickness of photo resist of TFT channels in the driving region 02 may be smaller than the thickness of photo resist of TFT channels in the display region 01. Or, the above thickness detection process may also be performed in real time during batch developing. The embodiments of the present disclosure are not limited to this.

Step 2022b is to control the spray mount and/or the spray temperature of the concentration regulating assembly depending on the thickness of photo resist in the respective developing regions after the developing agents have been sprayed onto the respective developing regions.

As shown in FIG. 4, the developing regions on the substrate 00 to be developed may include: a display region 01 and a driving region 02 located around the display region 01 and provided with a gate driving circuit. The control assembly 12 may calculate difference between thickness of photo resist in the display region 01 after the developing agent has been sprayed onto the display region and thickness of photo resist in the driving region 02 after the developing agent has been sprayed onto the driving region, and the spray mount and/or the spray temperature of the concentration regulating assembly is controlled depending on the difference such that the spray mount and/or the spray temperature of the concentration regulating assembly are/is in positive correlation with the difference.

As an example, correspondence between the difference in thickness of photo resist and the regulating parameter listed in Table 1 may be stored in the control assembly 12. The regulating parameter includes the spray mount and spray temperature, where the spray mount v1<v2<v3. Seen from the Table 1, as the difference in thickness of photo resist increases, the spray mount at which the concentration regulating assembly sprays the regulating liquid onto the target developing region becomes enhanced and the spray temperature (i.e., the temperature of the regulating liquid) of the concentration regulating assembly upon spraying the regulating liquid onto the target developing region also becomes enhanced. It is assumed that the detection results transmitted by the thickness detection assembly 14 and received by the control assembly 12 include: the thickness of photo resist of TFT channels in the display region 01 of 0.5 micrometers (μm), the thickness of photo resist of TFT channels in the driving region 02 of 0.4 μm; the difference between the thicknesses of photo resist in such two regions is 0.1 μm, thus, from the correspondence shown in stable 1, the control assembly 12 may determine that the concentration regulating assembly 11 has the spray mount of v1 ml/s and the spray temperature of 23° C. in batch developing process.

TABLE 1

| Difference in thickness of photo resist (μm) | Spray mount (ml/s) | Spray temperature (° C.) |
| --- | --- | --- |
| 0.1 | v1 | 23 |
| 0.3 | v2 | 28 |
| 0.5 | v3 | 30 |

Thus, during the batch developing, the concentration regulating assembly 11 may spray the regulating liquid onto the target developing region depending on the spray mount of v1 ml/s and the spray temperature of 23° C. set by the control assembly 12, such that after the developing process ends, the thicknesses of photo resist in the respective developing regions are same, so as to improve the developing uniformity.

It should be noted that, generally, the larger the spray mount of the concentration regulating assembly is, the larger the regulating concentration amount of the developing agent in the target developing region is; and the higher the spray temperature of the regulating liquid sprayed by the concentration regulating assembly is, the faster the developing speed of the target developing region is.

In practice, after the developing device ends the above developing operation, the developed substrate may be sent into a cleaning unit. The cleaning unit may spray the de-ionized water onto a surface of the substrate so as to clean up the residual developing agent on the substrate. The cleaned substrate is moved into an inclined status (the inclination angle may be about 5 degrees) from a horizontal status and transported to a gas knife dryer for drying the substrate. The dried substrate is then moved into the horizontal status back from the inclined status, so as to enter the further etching procedure.

In summary, an embodiment of the present disclosure provides a developing method. When the substrate to be developed is developed by the method, the regulating liquid may be sprayed by the concentration regulating assembly onto the target developing region on the substrate to be developed, thus, the concentration of the developing agent in the respective developing regions on the substrate to be developed may be regulated by the concentration regulating assembly, so as to allow the same developing speed in the respective developing regions on the substrate to be developed in the developing process and to improve the developing uniformity of the developing device upon developing the substrate.

An embodiment of the present disclosure provides a developing device. As shown in FIG. 1, the developing device includes: a spraying assembly 10 configured to spray developing agents with the same concentration onto respective developing regions on a substrate 00 to be developed; and a concentration regulating assembly 11 configured to spray a regulating liquid onto a target developing region on the substrate 00 to be developed to change concentration of the developing agents such that the respective developing regions on the substrate 00 to be developed have the same developing speed during a developing process.

In summary, an embodiment of the present disclosure provides a developing device. The developing device not only includes the spraying assembly, but also includes the concentration regulating assembly. The concentration regulating assembly can spray the regulating liquid onto the target developing region of the substrate to be developed, thus, the concentration of the developing agent in the respective developing regions on the substrate to be developed may be regulated by the concentration regulating assembly, so as to allow the same developing speed in the respective developing regions on the substrate to be developed in the developing process and to improve the developing uniformity of the developing device upon developing the substrate.

As an example, FIG. 4 is a schematic view showing a structure of another developing device according to an embodiment of the present disclosure. As shown in FIG. 4, the developing regions on the substrate 00 to be developed may include: a display region 01 and a driving region 02 located around the display region 01 and provided with a gate driving circuit.

In an embodiment of the present disclosure, on one hand, the target developing region may be the driving region 02 and the regulating liquid can dilute the concentration of the developing agent, in this case, the regulating liquid may for example be de-ionized water. By means of spraying the de-ionized water in form of mist by the concentration regulating assembly 11 onto the driving region 02, the concentration of the developing agent in the driving region 02 may be diluted such that the real-time concentration of the developing agent in the driving region 02 is equal to the real-time concentration of the developing agent in the display region 01, so as to allow the respective developing regions on the substrate 00 to be developed to keep the same developing speed in the developing process.

On the other hand, the target developing region may also be the display region 01 and the regulating liquid can increase the concentration of the developing agent, in this case, the regulating liquid may be developing agent with concentration greater than a predetermined threshold. The predetermined threshold may be the concentration of the developing agent sprayed by the spraying assembly 10. By means of spraying the developing agent with the concentration greater than the predetermined threshold by the concentration regulating assembly 11 onto the display region 01, the concentration of the developing agent in the display region 01 may be increased such that the real-time concentration of the developing agent in the display region 01 can be equal to the real-time concentration of the developing agent in the driving region 02, so as to ensure the respective developing regions on the substrate 00 to be developed to keep the same developing speed during the developing process.

As an example, with reference to FIG. 5, the developing device may further include: a control assembly 12. The control assembly 12 is electrically connected to the concentration regulating assembly 11 and configured to control a regulating parameter of the concentration regulating assembly 11. The regulating parameter may include at least one of an operation status, a spray mount and a spray temperature, the operation status including switching on or switching off. The spray temperature of the concentration regulating assembly means the temperature of the regulating liquid sprayed by the concentration regulating assembly.

When the regulating parameter includes the operation status, with reference to FIG. 5, the developing device may further include a region detection assembly 13. The region detection assembly 13 is electrically connected to the control assembly 12. The region detection assembly 13 is configured to, during a developing process, detect whether a developing region to which a spraying direction of the concentration regulating assembly 11 is directed on the substrate to be developed is the target developing region, or not.

When the developing region to which the spraying direction of the concentration regulating assembly 11 is directed on the substrate to be developed is the target developing region, the region detection assembly is configured to send a switch-on instruction to the control assembly 12 to cause the control assembly 12 to switch on the concentration regulating assembly 11 depending on the switch-on instruction.

When the developing region to which the spraying direction of the concentration regulating assembly 11 is directed on the substrate to be developed is not the target developing region, the region detection assembly 13 is configured to send a switch-off instruction to the control assembly 12 to cause the control assembly 12 to switch off the concentration regulating assembly 11 depending on the switch-off instruction.

In practice, the region detection assembly may for example be a grating scale sensor which may be arranged in the concentration regulating assembly. The grating scale may be arranged in the respective developing regions on the substrate to be developed. During the developing process, when the concentration regulating assembly moves with respect to the substrate to be developed, the grating scale sensor may detect and recognize the leading and trailing positions of the respective developing regions by means of the grating scales in different developing regions.

As an example, when the regulating parameter includes the spray mount and/or the spray temperature, with reference to FIG. 5, the developing device may further include: a thickness detection assembly 14.

The thickness detection assembly 14 is electrically connected to the control assembly 12 and configured to detect thickness of photo resist in the respective developing regions on the substrate to be developed after the developing agents have been sprayed onto the respective developing regions on the substrate and send the thickness of photo resist in the respective developing regions on the substrate to be developed after the developing agents have been sprayed onto the respective developing regions to the control assembly 12.

The control assembly 12 is further configured to control the spray mount and/or the spray temperature of the concentration regulating assembly 11 upon spraying the regulating liquid, depending on the thickness of photo resist in the respective developing regions after the developing agents have been sprayed onto the respective developing regions.

It should be noted that in practice, the control assembly, the region detection assembly and the thickness detection assembly may be three separate assemblies; or the region detection assembly and the thickness detection assembly may also be integrated into the control assembly, that is, the control assembly may also have functions of region detection and thickness detection.

Further, with reference to FIG. 4, the spraying assembly 10 may include a plurality of nozzles arranged along a first direction x and spaced from each other and the concentration regulating assembly 11 may include a plurality of pinhole-shaped nozzles 16 arranged along a first direction x and spaced from each other. As an example, as shown in FIG. 4, the concentration regulating assembly 11 may include a plurality of superfine pinhole-shaped nozzles arranged densely. As each of the pinhole-shaped nozzles has smaller spray mount, the spray mount of the concentration regulating assembly may be adjusted accurately by controlling the number of the pinhole-shaped nozzles that are switched on during the developing process. Thus, the accuracy of regulation of the concentration regulating assembly 11 may be improved.

It should be noted that in practice, when the control assembly 12 controls the operation status of the concentration regulating assembly 11, the operation status of each of the pinhole-shaped nozzles may be controlled respectively. For example, the control assembly 12 may combine the switch-on and switch-off statuses of the respective pinhole-shaped nozzles in any ways.

As an example, with reference to FIG. 4, the developing device may further include: a transport assembly 15. The transport assembly 15 may include a plurality of transporting rollers 150 arranged along the second direction y and spaced from each other.

The transport assembly 15 is configured to carry the substrate to be developed and transport the substrate along a second direction y, the second direction being perpendicular to the first direction x. As shown in FIG. 4 and FIG. 6, the spraying assembly 10 and the concentration regulating assembly 11 are fixed above the transport assembly 15 and arranged in sequence above the transport assembly 15 along the second direction y.

The developing device provided by the embodiment of the present disclosure may be arranged in a developing cavity. The developing cavity has an inlet and an outlet. The transport assembly 15 may transport the substrate 00 to be developed from the inlet of the developing cavity along the second direction y to the outlet of the developing cavity. During transporting the substrate 00 to be developed, the spraying assembly 10 may at first spray the developing agents onto the respective developing regions on the substrate to be developed. And then, when the target developing region on the substrate 00 to be developed is transported to the region to which the spraying direction of the concentration regulating assembly 11 is directed, the concentration regulating assembly 11 may spray the regulating liquid onto the target developing region.

Further, as shown in FIG. 4, a length d of the concentration regulating assembly 11 in the first direction x is equal to a width w of the substrate 00 to be developed such that it can ensure the spraying range of the concentration regulating assembly 11 may cover the respective developing regions on the substrate 00 to be developed. The widthwise direction of the substrate 00 to be developed is parallel to the first direction x.

It should be noted that the developing process in the embodiments of the present disclosure means the process of dissolving photo resist by the developing agents and the developing speed is the speed of dissolving photo resist.

In summary, an embodiment of the present disclosure provides a developing device. The developing device not only includes the spraying assembly, but also includes the concentration regulating assembly. The concentration regulating assembly can spray the regulating liquid onto the target developing region of the substrate to be developed, thus, the concentration of the developing agent in the respective developing regions on the substrate to be developed may be regulated by the concentration regulating assembly, so as to ensure the same developing speed in the respective developing regions on the substrate to be developed in the developing process. It may prevent the driving region from being developed excessively due to too high concentration of developing agents. It also avoid too thin photo resist layer or lack of photo resist in TFT channels in the driving region to prevent an active layer in TFT channels from being etched through to be opened (also called "channel open failure") in etching process. In this way, it may improve the developing uniformity of the developing device upon developing the substrate, reduce the probability that failures occur in the driving region of the substrate and enhance the yield of the products. The developing device provided by the embodiments of the present disclosure may be applied in the developing process of different products without changing movement of the substrate in the conventional developing process and the method of coating the developing agents. Therefore, it will not introduce additional factors that may cause non-uniformity of developing.

The skilled person in the art can know clearly that the specific working processes of the above developing device may refer to the corresponding description in the above embodiments of the method, for brevity and convenience. The details will be omitted here. In addition, the phrase of "and/or" in the present disclosure only describes an associated relation of associated objects. The phrase represents that there are three relations, for example, A and/or B may represent three circumstances, i.e., A separately, both A and B, B separately.

The above embodiments are only exemplary embodiments of the present disclosure, instead of limiting the present disclosure. All of modifications, alternatives, improvements made without departing from the principles and spirit of the disclosure should fall within the protection scope of the present disclosure.

What is claimed is:

1. A developing method comprising:
   spraying developing agents by a spraying assembly onto a plurality of respective developing regions on a substrate to be developed; and
   spraying a regulating liquid by a concentration regulating assembly onto a target developing region on the substrate to be developed to change concentration of the developing agents,
   wherein spraying a regulating liquid by a concentration regulating assembly onto the target developing region on the substrate to be developed to change concentration of the developing agents comprises:
     controlling a regulating parameter of the concentration regulating assembly such that the concentration regulating assembly sprays the regulating liquid onto the target developing region on the substrate to be developed depending on the regulating parameter to change concentration of the developing agents, the regulating parameter comprising at least one of an operation status, a spray mount and spray temperature, and the operation status comprising switching on or switching off.

2. The developing method according to claim 1, wherein the developing agents sprayed by the spraying assembly onto the plurality of respective developing regions on the substrate to be developed have a same concentration.

3. The developing method according to claim 1, wherein the plurality of respective developing regions on the substrate to be developed have a same developing speed during a developing process.

4. The developing method according to claim 1, wherein the regulating parameter comprises the operation status, and controlling the regulating parameter of the concentration regulating assembly comprises:
   during a developing process, detecting whether a present developing region to which a spraying direction of the concentration regulating assembly is directed on the substrate to be developed is the target developing region, or not;

switching on the concentration regulating assembly when the present developing region to which the spraying direction of the concentration regulating assembly is directed on the substrate to be developed is the target developing region; or switching off the concentration regulating assembly when the present developing region to which the spraying direction of the concentration regulating assembly is directed on the substrate to be developed is not the target developing region.

5. The developing method according to claim 1, wherein the regulating parameter comprises the spray mount and/or the spray temperature, and controlling the regulating parameter of the concentration regulating assembly comprises:

detecting a thickness of photo resist in at least one of the plurality of respective developing regions on the substrate to be developed after the developing agents have been sprayed onto the plurality of respective developing regions;

controlling the spray mount and/or the spray temperature of the concentration regulating assembly depending on the thickness of photo resist in the at least one of the plurality of respective developing regions after the developing agents have been sprayed onto the respective developing regions.

6. The developing method according to claim 5, wherein the at least one of the plurality of developing regions on the substrate to be developed comprise: a display region and a driving region located around the display region and provided with a gate driving circuit; and wherein controlling the spray mount and/or the spray temperature of the concentration regulating assembly depending on the thickness of photo resist in the plurality of respective developing regions after the developing agents have been sprayed onto the plurality of respective developing regions comprises:

calculating difference between thickness of photo resist in the display region after the developing agent has been sprayed onto the display region and thickness of photo resist in the driving region after the developing agent has been sprayed onto the driving region, controlling the spray mount and/or the spray temperature of the concentration regulating assembly depending on the difference such that the spray mount and/or the spray temperature of the concentration regulating assembly is in positive correlation with the difference.

7. The developing method according to claim 1, wherein the plurality of developing regions on the substrate to be developed comprise: a display region and a driving region located around the display region and provided with a gate driving circuit; and wherein the target developing region is the driving region and the regulating liquid is configured to dilute concentration of the developing agent; or the target developing region is the display region and the regulating liquid is configured to increase concentration of the developing agent.

8. A developing device comprising:

a spraying assembly configured to spray developing agents onto a plurality of respective developing regions on a substrate to be developed;

a concentration regulating assembly configured to spray a regulating liquid onto a target developing region on the substrate to be developed to change concentration of the developing agents; and a control assembly;

wherein the control assembly is electrically connected to the concentration regulating assembly and configured to control a regulating parameter of the concentration regulating assembly such that the concentration regulating assembly sprays the regulating liquid onto the target developing region on the substrate to be developed depending on the regulating parameter to change concentration of the developing agents, the regulating parameter comprising at least one of an operation status, a spray mount and a spray temperature, and the operation status comprising switching on or switching off.

9. The developing device according to claim 8, wherein the spraying assembly is configured to spray developing agents with same concentration onto the plurality of respective developing regions on the substrate to be developed.

10. The developing device according to claim 8, wherein the concentration regulating assembly is configured to spray the regulating liquid onto the target developing region on the substrate to be developed to change concentration of the developing agents such that the plurality of respective developing regions on the substrate to be developed have a same developing speed during a developing process.

11. The developing device according to claim 10, wherein the spraying assembly comprises a plurality of nozzles arranged along a first direction and spaced from each other and the concentration regulating assembly comprises a plurality of pinhole-shaped nozzles arranged along the first direction and spaced from each other.

12. The developing device according to claim 11, wherein the developing device further comprises:

a transport assembly configured to carry the substrate to be developed and transport the substrate along a second direction, the second direction being perpendicular to the first direction;

wherein the spraying assembly and the concentration regulating assembly are fixed above the transport assembly.

13. The developing device according to claim 12, wherein the transport assembly comprises a plurality of transporting rollers arranged along the second direction and spaced from each other.

14. The developing device according to claim 12, wherein the spraying assembly and the concentration regulating assembly are arranged along the second direction above the transport assembly.

15. The developing device according to claim 11, wherein a length of the concentration regulating assembly in the first direction is equal to a width of the substrate to be developed in a widthwise direction, the widthwise direction of the substrate to be developed being parallel to the first direction.

16. The developing device according to claim 10, wherein the regulating liquid comprises de-ionized water or developing agent with concentration greater than a predetermined threshold.

17. The developing device according to claim 8, wherein the regulating parameter comprises the operation status, and the developing device further comprises a region detection assembly electrically connected to the control assembly, wherein the region detection assembly is configured to:

detect, during a developing process, whether a present developing region to which a spraying direction of the concentration regulating assembly is directed on the substrate to be developed is the target developing region, or not;

send a switch-on instruction to the control assembly to cause the control assembly to switch on the concentration regulating assembly depending on the switch-on instruction when the present developing region to which the spraying direction of the concentration regulating assembly is directed on the substrate to be developed is the target developing region; or send a switch-off instruction to the control assembly to cause the control assembly to switch off the concentration regulating assembly depending on the switch-off instruction when the present developing region to which the spraying direction of the concentration regulating assembly is directed on the substrate to be developed is not the target developing region.

18. The developing device according to claim 8, wherein the regulating parameter comprises the spray mount and/or the spray temperature, and wherein the developing device further comprises:

a thickness detection assembly electrically connected to the control assembly and configured to detect thickness of photo resist in the plurality of respective developing regions on the substrate to be developed after the developing agents have been sprayed onto the plurality of respective developing regions and send the thickness of photo resist in the plurality of respective developing regions on the substrate to be developed after the developing agents have been sprayed onto the plurality of respective developing regions to the control assembly; and wherein the control assembly is further configured to control the spray mount and/or the spray temperature of the concentration regulating assembly for spraying the regulating liquid, depending on the thickness of photo resist in the plurality of respective developing regions after the developing agents have been sprayed onto the plurality of respective developing regions.

* * * * *